US007213226B2

(12) United States Patent
Kotani et al.

(10) Patent No.: US 7,213,226 B2
(45) Date of Patent: May 1, 2007

(54) PATTERN DIMENSION CORRECTION METHOD AND VERIFICATION METHOD USING OPC, MASK AND SEMICONDUCTOR DEVICE FABRICATED BY USING THE CORRECTION METHOD, AND SYSTEM AND SOFTWARE PRODUCT FOR EXECUTING THE CORRECTION METHOD

(75) Inventors: Toshiya Kotani, Tokyo (JP); Shigeki Nojima, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 351 days.

(21) Appl. No.: 10/920,397

(22) Filed: Aug. 18, 2004

(65) Prior Publication Data

US 2005/0081180 A1 Apr. 14, 2005

(30) Foreign Application Priority Data

Aug. 20, 2003 (JP) ............................. 2003-296238

(51) Int. Cl.
G06F 17/50 (2006.01)
(52) U.S. Cl. ............................. 716/21; 716/19; 430/30
(58) Field of Classification Search .................. 716/19, 716/21, 4; 430/30
See application file for complete search history.

(56) References Cited

U.S. PATENT DOCUMENTS

| 5,879,844 | A | * | 3/1999 | Yamamoto et al. ........... 430/30 |
| 6,343,370 | B1 | | 1/2002 | Taoka et al. |
| 6,463,403 | B1 | * | 10/2002 | Burdorf et al. ............... 703/22 |
| 6,562,638 | B1 | * | 5/2003 | Balasinski et al. ............ 438/14 |
| 6,928,636 | B2 | * | 8/2005 | Ohnuma ...................... 716/21 |
| 2004/0139418 | A1 | * | 7/2004 | Shi et al. ...................... 716/19 |
| 2005/0055658 | A1 | * | 3/2005 | Mukherjee et al. ........... 716/19 |

FOREIGN PATENT DOCUMENTS

| JP | 09-319067 | 12/1997 |
| JP | 2002-318448 | 10/2002 |
| JP | 2003-107664 | 4/2003 |

OTHER PUBLICATIONS

Newmark, D. M. et al., "Large Area Optical Proximity Correction Using Pattern Based Corrections", SPIE, vol. 2322, Photomask Technology and Management, pp. 374-386, (1994).

* cited by examiner

*Primary Examiner*—Vuthe Siek
*Assistant Examiner*—Magid Y. Dimyan
(74) *Attorney, Agent, or Firm*—Finnegan, Henderson, Farabow, Garrett & Dunner, L.L.P.

(57) ABSTRACT

A method of correcting a finish pattern dimension by using OPC when a design pattern is formed on a wafer, including selecting and determining a first design pattern included in the design pattern; acquiring a measurement value of a first finish pattern dimension when the first design pattern is formed on a wafer; determining a first calculation model by using the first finish pattern dimension; selecting and determining a second design pattern from the design pattern except for the first design pattern; performing first simulation by using the first calculation model, and calculating a second finish pattern dimension when the second design pattern is formed on a wafer; determining a second calculation model for performing second simulation which is faster than the first simulation, by using the first and second finish pattern dimensions; and performing the second simulation by using the second calculation model, and calculating a third finish pattern dimension of a third design pattern of the design pattern except for the first and second design patterns.

20 Claims, 12 Drawing Sheets

PATTERN DIMENSION CORRECTION METHOD AND VERIFICATION METHOD USING OPC, MASK AND SEMICONDUCTOR DEVICE FABRICATED BY USING THE CORRECTION METHOD, AND SYSTEM AND SOFTWARE PRODUCT FOR EXECUTING THE CORRECTION METHOD

CROSS REFERENCE TO RELATED APPLICATION

This application is based upon and claims benefit of priority under 35 USC 119 from the Japanese Patent Application No. 2003-296238, filed on Aug. 20, 2003, the entire contents of which are incorporated herein by reference.

RELATED ART

The present invention relates to a pattern dimension correction method and verification method using OPC, a mask and semiconductor device fabricated by using the correction method, and a system and software product for executing the correction method.

The progress of the recent semiconductor fabrication techniques is remarkable. For example, semiconductor devices having a minimum processing dimension of 0.13 µm are mass-produced. This micropatterning is realized by the rapid progress of the fine pattern formation techniques such as the mask process technique, optical lithography technique, and etching technique.

When pattern sizes were sufficiently large, it was possible to form a pattern substantially matching a design pattern on a wafer by directly drawing the planar shape of an LSI pattern to be formed as a design pattern on the wafer, forming a mask pattern faithful to the design pattern, transferring the mask pattern onto the wafer by a projection optical system, and etching the substrate.

As micropatterning of patterns advances, however, it becomes difficult to faithfully form a pattern in each process. This poses the problem that the finally finish dimension does not match that of the design pattern.

Especially in the lithography and etching processes most important to achieve micropatterning, the layout environment of patterns arranged around a pattern to be formed has a large effect on the dimensional accuracy of the pattern.

To reduce these effects, therefore, OPC (Optical Proximity Correction) and PPC (Process Proximity Correction) by which an auxiliary pattern is added to a design pattern in advance so that the processed dimension matches the desired dimension are disclosed in patent references 1 and 2 and non-patent reference 1 (to be described later). These techniques are essential in device fabrication.

Recently, a model base OPC method using a lithography simulator for accurately predicting finish dimensions on a wafer is most often used. This makes it very important to develop a correction method which achieves both high accuracy and high speed.

In the model base OPC, high-speed, high-accuracy processing is required for large-scale design data. The accuracy and speed are mainly determined by the calculation algorithm of a lithography simulator used in a correction value calculator of a model base OPC tool.

This correction value calculator has an optical calculator, development calculator, and non-optical calculator. The optical calculator relates to optical elements for predicting the intensity of light which irradiates a wafer. The development calculator simply represents the step in which a photosensitive agent (called a resist) applied on the wafer is developed by the light. The non-optical calculator relates to non-optical elements including a calculator for predicting a dimensional change after the developed resist is etched.

The optical calculator calculates the light intensity distributions of various design patterns on a wafer on the basis of parameters such as the exposure wavelength ($\lambda$) and lens numerical aperture (NA) of an exposure apparatus used, values ($\sigma$, $\epsilon$) which determine an illumination shape, and the transmittance and phase, which are determined by the type of mask used (e.g., a Cr mask, HT mask, or phase shift mask), of light which is transmitted through the mask.

The non-optical calculator incorporates a model for predicting the way the resist irradiated with light under the exposure conditions described above changes its dimensions after steps such as a baking step and development step called resist processes, and the way the dimensions change after the resist is etched.

In the model base OPC, therefore, it is important to rapidly and accurately predict the dimensions of a pattern formed on a wafer by combining the light intensity distribution calculated by the optical calculator with the non-optical calculator.

Several optical calculation methods are proposed. Examples are a TCC method which performs calculations strictly on the basis of the Hopkins equation, an OCA method which approximates the Hopkins equation, and a vector calculation method which takes account of light deflection and the like.

These methods have a tradeoff relationship between the accuracy and calculation time; the calculation time increases in the order of OCA, TCC, and vector calculation, but the accuracy of prediction of the light intensity on a wafer increases in the same order.

Various calculation models are also proposed for a calculator for performing calculations concerning development in the non-optical calculator. Examples are a Gaussian diffusion model which simply represents diffusion of an acid contained in a resist, and a VTR model which uses the various characteristics of light intensity as parameters.

It becomes important to predict the light intensity on a wafer at high accuracy and high speed by combining these optical calculation methods and non-optical calculation methods.

References describing the prior art are as follows.

Patent reference 1: Japanese Patent Laid-Open No. 09-319067

Patent reference 2: Japanese Patent Laid-Open No. 2001-375025

Non-patent reference 1: SPIE Vol. 2322 (1994) 374 (Large Area Optical Proximity Correction using Pattern Based Correction, D. M. Newmark et. al).

Normally, the calculation load in the optical calculation portion is larger than that in the non-optical calculation portion. Therefore, the conventional method is to predict the light intensity by the OCA model having high speed but low accuracy, combine non-optical model parameters with experimentally obtained dimensions on a wafer, and perform OPC on large-scale data by using the non-optical model parameters.

In this method, the errors from the experimental values often increase in the simplified non-optical model, since the accuracy of optical calculations is not so high. This makes it necessary to acquire an extremely enormous amount of experimental values, and combine the experimental values with very many non-optical model parameters, thereby optimizing the values of all the non-optical model parameters.

Accordingly, it is conventionally essential to acquire a very large amount of reliable experimental data from various patterns. This requires much labor and time and high cost.

SUMMARY OF THE INVENTION

According to one aspect of the present invention, there is provided a method of correcting a finish pattern dimension by using OPC when a design pattern is formed on a wafer, comprising:

selecting and determining a first design pattern included in the design pattern;

acquiring a measurement value of a first finish pattern dimension when the first design pattern is formed on a wafer;

determining a first calculation model by using the first finish pattern dimension;

selecting and determining a second design pattern from the design pattern except for the first design pattern;

performing first simulation by using the first calculation model, and calculating a second finish pattern dimension when the second design pattern is formed on a wafer;

determining a second calculation model for performing second simulation which is faster than the first simulation, by using the first and second finish pattern dimensions; and performing the second simulation by using the second calculation model, and calculating a third finish pattern dimension of a third design pattern of the design pattern except for the first and second design patterns.

According to one aspect of the present invention, there is provided a method of correcting a finish pattern dimension by using OPC when a design pattern is formed on a wafer, comprising:

selecting and determining a design pattern no. $1a$ included in the design pattern;

acquiring a measurement value of a finish pattern dimension no. $1a$ when the design pattern no. $1a$ is formed on a wafer;

determining a calculation model no. $1a$ by using the finish pattern dimension no. $1a$;

determining at least one calculation model no. $1b$ by changing a value of a parameter included in the calculation model no. $1a$;

selecting and determining a design pattern no. $2a$ from the design pattern except for the design pattern no. $1a$;

selecting and determining a design pattern no. $2b$ from the design pattern except for the design pattern no. $1b$;

performing simulation no. $1a$ by using the calculation model no. $1a$, and calculating a finish pattern dimension no. $2a$ when the design pattern no. $2a$ is formed on a wafer;

performing simulation no. $1b$ by using the calculation model no. $1b$, and calculating a finish pattern dimension no. $2b$ when the design pattern no. $2b$ is formed on a wafer;

determining a calculation model no. $2a$ for performing simulation no. $2a$ which is faster than the simulation no. $1a$, by using the finish pattern dimension nos. $1a$ and $2a$;

determining a calculation model no. $2b$ for performing simulation no. $2b$ which is faster than the simulation no. $1b$, by using the finish pattern dimension nos. $1b$ and $2b$;

performing the simulation no. $2a$ by using the calculation model no. $2a$, and calculating a finish pattern dimension no. $3a$ of a design pattern no. $3a$ of the design pattern except for the design pattern nos. $1a$ and $2a$; and performing the simulation no. $2b$ by using the calculation model no. $2b$, and calculating a finish pattern dimension no. $3b$ of a design pattern no. $3b$ of the design pattern except for the design pattern nos. $1b$ and $2b$.

According to one aspect of the present invention, there is provided a mask formed by using first, second, and third finish pattern dimensions obtained by a pattern dimension correction method which uses OPC and comprises:

selecting and determining a first design pattern included in the design pattern;

acquiring a measurement value of a first finish pattern dimension when the first design pattern is formed on a wafer;

determining a first calculation model by using the first finish pattern dimension;

selecting and determining a second design pattern from the design pattern except for the first design pattern;

performing first simulation by using the first calculation model, and calculating a second finish pattern dimension when the second design pattern is formed on a wafer;

determining a second calculation model for performing second simulation which is faster than the first simulation, by using the first and second finish pattern dimensions; and performing the second simulation by using the second calculation model, and calculating a third finish pattern dimension of a third design pattern of the design pattern except for the first and second design patterns.

According to one aspect of the present invention, there is provided a semiconductor device fabricated by using a mask formed by using first, second, and third finish pattern dimensions obtained by a pattern dimension correction method which uses OPC and comprises:

selecting and determining a first design pattern included in the design pattern;

acquiring a measurement value of a first finish pattern dimension when the first design pattern is formed on a wafer;

determining a first calculation model by using the first finish pattern dimension;

selecting and determining a second design pattern from the design pattern except for the first design pattern;

performing first simulation by using the first calculation model, and calculating a second finish pattern dimension when the second design pattern is formed on a wafer;

determining a second calculation model for performing second simulation which is faster than the first simulation, by using the first and second finish pattern dimensions; and performing the second simulation by using the second calculation model, and calculating a third finish pattern dimension of a third design pattern of the design pattern except for the first and second design patterns.

According to one aspect of the present invention, there is provided a system for executing a method of correcting a finish pattern dimension by using OPC when a design pattern is formed on a wafer, comprising:

a first finish pattern dimension input unit which inputs a measurement value of a first finish pattern dimension when a first design pattern selected from the design pattern is formed on a wafer;

a first calculation model determination unit which determines a first calculation model by using the input first finish pattern dimension;

a second design pattern input unit which inputs a second design pattern of the design pattern except for the first design pattern;

a first simulation unit which performs first simulation by using the first calculation model, and calculates a second finish pattern dimension when the second design pattern is formed on a wafer;

a second calculation model determination unit which determines a second calculation model for performing second simulation which is faster than the first simulation, by using the first and second finish pattern dimensions; and a second simulation unit which performs the second simulation by using the second calculation model, and calculates a third finish pattern dimension of a third design pattern of the design pattern except for the first and second design patterns.

According to one aspect of the present invention, there is provided a software product obtained by recording, in a computer-readable medium, a program for implementing, on a computer, a system for executing a method of correcting a finish pattern dimension by using OPC when a design pattern is formed on a wafer, wherein the program comprises:

a first finish pattern dimension input unit which inputs a measurement value of a first finish pattern dimension when a first design pattern selected from the design pattern is formed on a wafer;

a first calculation model determination unit which determines a first calculation model by using the input first finish pattern dimension;

a second design pattern input unit which inputs a second design pattern of the design pattern except for the first design pattern;

a first simulation unit which performs first simulation by using the first calculation model, and calculates a second finish pattern dimension when the second design pattern is formed on a wafer;

a second calculation model determination unit which determines a second calculation model for performing second simulation which is faster than the first simulation, by using the first and second finish pattern dimensions; and a second simulation unit which performs the second simulation by using the second calculation model, and calculates a third finish pattern dimension of a third design pattern of the design pattern except for the first and second design patterns.

DETAILED DESCRIPTION OF THE INVENTION

Embodiments of the present invention will be described below with reference to the accompanying drawings.

(1) First Embodiment

Figure 1:
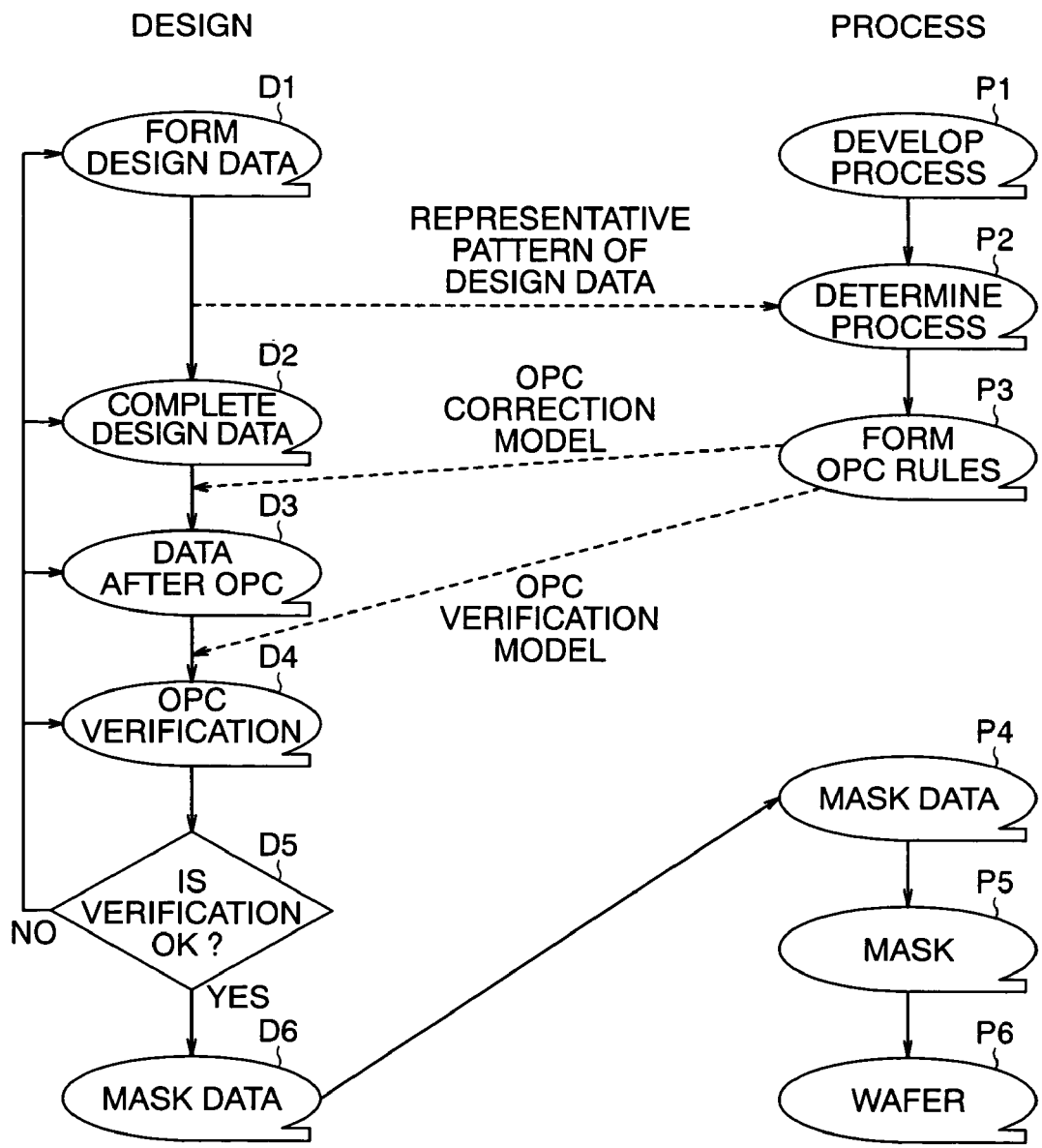
FIG. 1 is a flowchart showing the flow of pattern dimension correction and verification according to an embodiment of the present invention.

First, the flows of design and process according to this embodiment are shown in a time series manner in the flowchart of FIG. 1.

In the design flow, design data is formed in step D1.

In the process flow, process development is advanced in step P1.

A representative pattern of the design data formed in step D1 of the design flow is selected, determined, and sent to the process side.

On the process side, process conditions are determined in step P2. An experiment of forming a pattern on a wafer is conducted under the determined process conditions, thereby acquiring measurement data pertaining to the dimensions and shape of the pattern.

In step P3, the acquired measurement data is used to form a calculation model which gives preference to one of accuracy and speed, as will be described later. The formed calculation model is given as a correction model using OPC or an OPC verification model to the design side.

On the design side, the design data is completed in step D2.

In step D3, OPC correction is performed for this design data by using the OPC correction model, thereby obtaining data after OPC.

In step D4, OPC verification is performed for this data after OPC by using the OPC verification data formed in step P3.

In step D5, whether a good result is obtained by the verification is determined. If no good result is obtained, steps D1 to D4 are repeated. If a good result is obtained, the data is completed as mask data in step D6.

The mask data thus obtained by pattern design is used in step P4 in process design. A mask is fabricated in step P5, and a wafer is fabricated in step P6.

Figure 2:
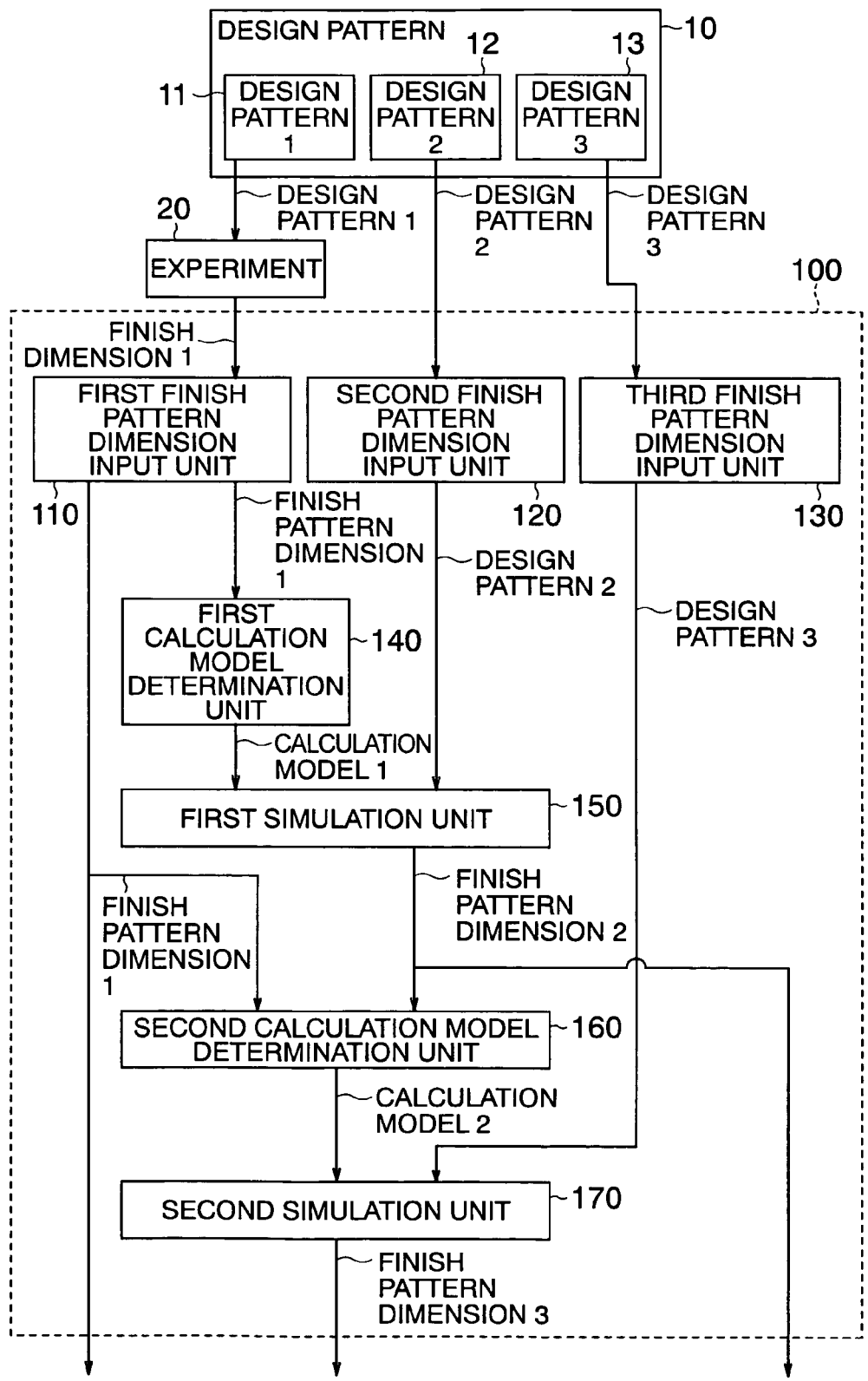
FIG. 2 is a block diagram showing the configuration of a system for realizing a pattern dimension correction method according to the first embodiment of the present invention.

FIG. 2 shows the configuration of a system 100 for realizing a pattern dimension correction method using OPC according to this embodiment.

A design pattern 10 includes a representative design pattern 1 11 and other design patterns 2 12 and 3 13.

Design patterns 1, 2, and 3 can be different from each other in at least one of a design pattern line width and the distance between adjacent design patterns.

An experiment 20 is conducted by forming a mask by using the design pattern 1 11, forming a pattern on a wafer by using the mask, and measuring the dimension of the obtained pattern. The measurement value is input as finish pattern dimension 1 to a first finish pattern dimension input unit 110.

Design pattern 2 is input to a second design pattern input unit 120. Design pattern 3 is input to a third design pattern input unit 130.

Finish pattern dimension 1 is input to a first calculation model 140. Parameters of calculation model 1 used in a first simulation unit 150 which gives preference to accuracy are determined, and given to the first simulation unit 150.

The first simulation unit 150 is also given design pattern 2 from the second design pattern input unit 120. The first simulation unit 150 performs simulation which gives preference to accuracy on the basis of calculation model 1 by using design pattern 2, and outputs finish pattern dimension 2 as a result of simulation.

A second calculation model determination unit 160 receives finish pattern dimension 1 output from the first finish pattern dimension input unit 110, and finish pattern dimension 2 output from the first simulation unit 150. The second calculation model determination unit 160 determines parameters of calculation model 2 for performing second simulation which gives preference to speed when compared to the first simulation.

On the basis of calculation model 2, a second simulation unit 170 outputs finish pattern dimension 3 by using design pattern 3 output from the third design pattern input unit 130. Finish pattern dimensions 1, 2, and 3 can be any one of a resist dimension after a lithography process, a processed dimension after an etching process, and a finally processed dimension after a final process.

Obtaining finish pattern dimensions by forming and measuring patterns by experiments is time-consuming and cost-consuming, so it is difficult to obtain a large amount of measurement data.

By contrast, in this embodiment, a pattern is formed and measured with respect to representative design pattern 1, and other design patterns 2 and 3 are obtained by simulation in addition to obtained finish pattern dimension 1. This simulation does not give any preference to accuracy or speed, but realizes both high accuracy and high speed by performing high-accuracy first simulation, and performing high-speed second simulation by using the obtained result.

That is, high-accuracy calculation model 1 is determined by using finish pattern dimension 1 obtained by an experiment, and finish pattern dimension 2 is obtained by performing first simulation by using design pattern 2. Calculation model 2 which gives preference to speed is determined by using finish pattern dimensions 1 and 2. Finish pattern dimension 3 is obtained by performing second simulation by using remaining design pattern 3.

In this manner, necessary finish pattern dimensions 1, 2, and 3 can be obtained by performing high-accuracy, high-speed simulations with few experiments.

The procedure of the method of correcting pattern dimensions by OPC by using the above system will be explained below.

Figure 3:
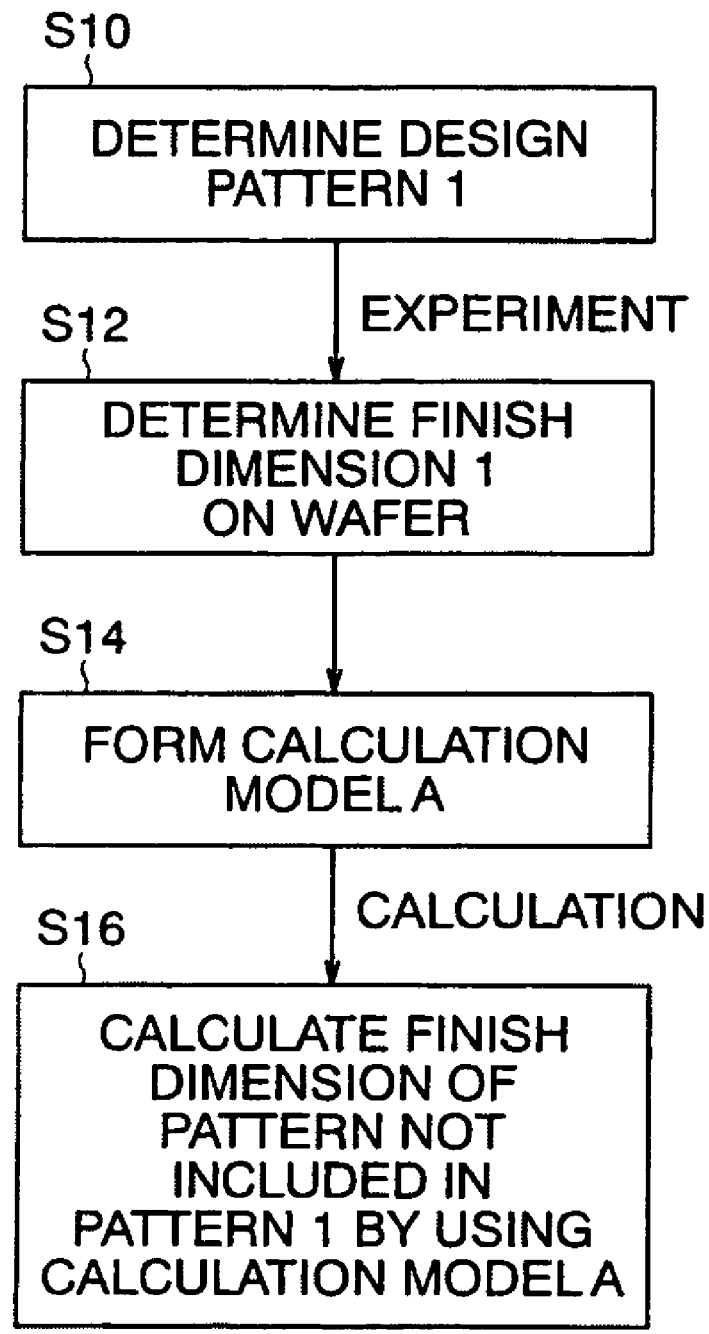
FIG. 3 is a flowchart showing a conventional pattern dimension correction method.

First, FIG. 3 shows the procedure of a conventionally performed pattern dimension correction method.

In step S10, a representative one of patterns included in design patterns is selected and determined as design pattern 1.

In step S12, a photomask is formed under specific process conditions on the basis of design pattern 1, and a pattern is formed on a wafer by using the mask. The finish dimension of the obtained pattern is measured by using a high-resolution measurement apparatus such as an SEM or TEM. Finish dimension 1 on the wafer is determined by thus performing an experiment on the basis of design pattern 1.

In step S14, model parameter 1 matching obtained finish dimension 1 is determined, and calculation model A is formed. Assume that calculation model A is used in simulation which gives preference to accuracy, or in simulation which gives preference to speed.

In step S16, OPC is performed using calculation model A, thereby calculating finish dimensions of various design patterns not included in design pattern 1.

Note that when calculation model A is formed, the accuracy and speed have a tradeoff relationship.

For example, to accurately simulate all various design patterns when calculation model A has high speed but low accuracy, it is necessary to increase the number of types of design pattern 1 as a representative pattern, form patterns based on these types by experiments, and measure all these patterns. This requires much labor and time and high cost.

On the other hand, when calculation model A is accurate but time-consuming, only a few types of calculation pattern 1 as a representative pattern are necessary, so the experimental load is small. However, it takes a long time to predict the dimensions of all design patterns by simulation.

Figure 4:
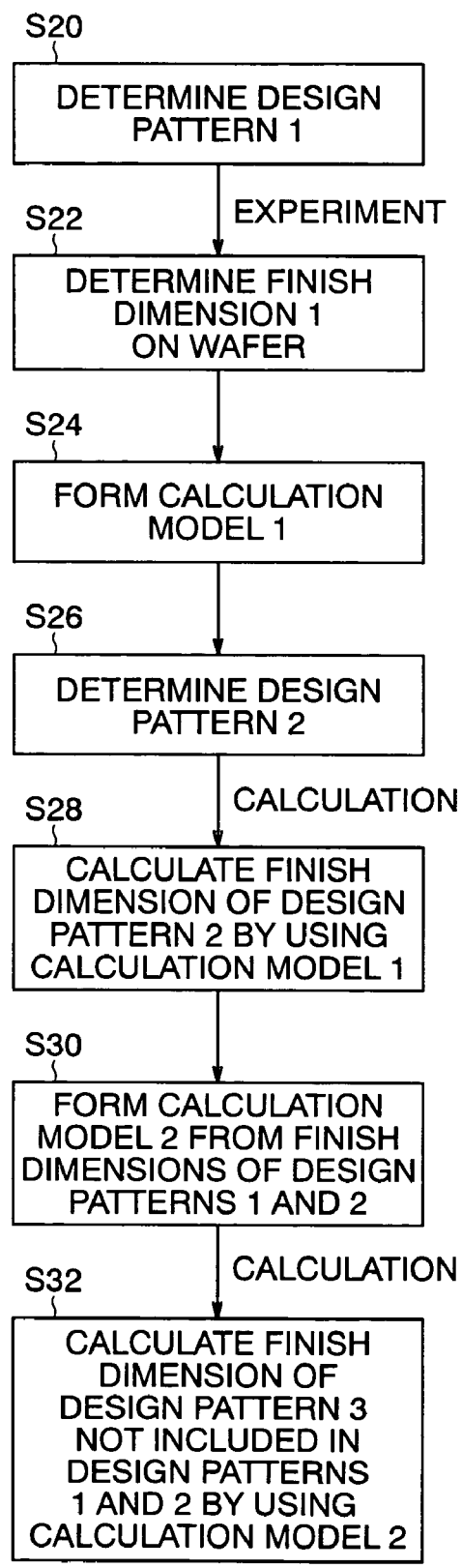
FIG. 4 is a flowchart showing the pattern dimension correction method according to the first embodiment.

The pattern dimension correction method according to this embodiment is performed following the procedure shown in FIG. 4.

In step S20, design pattern 1 is selected and determined as a representative pattern from patterns included in all design patterns. To decrease the experimental load, it is desirable to minimize the number of design patterns 1.

In step S22, an experiment is conducted by using design pattern 1. That is, a mask is formed under specific process conditions on the basis of design pattern 1, a pattern is formed on a wafer by using the mask, and finish dimension 1 of the pattern is measured by using a high-resolution measurement apparatus such as an SEM or TEM.

In step S24, model parameter 1 matching obtained finish dimension 1 is determined, calculation model 1 is formed, and a parameter value of calculation model 1 is determined. Assume that accuracy has preference to speed in calculation model 1.

In step S26, design pattern 2 is determined from patterns, except for design pattern 1, included in design patterns.

In step S28, simulation is performed using calculation model 1 to calculate the finish dimension of design pattern 2.

In step S30, on the basis of the finish dimension of design pattern 1 obtained by the experiment and the finish pattern of design pattern 2 calculated by high-accuracy simulation, a parameter value of high-speed calculation model 2 in which speed has preference to accuracy is determined, thereby forming calculation model 2.

In step S32, high-speed simulation is performed using calculation model 2 to calculate the finish dimensions of all remaining design patterns 3 not included in design patterns 1 and 2.

Figure 5:
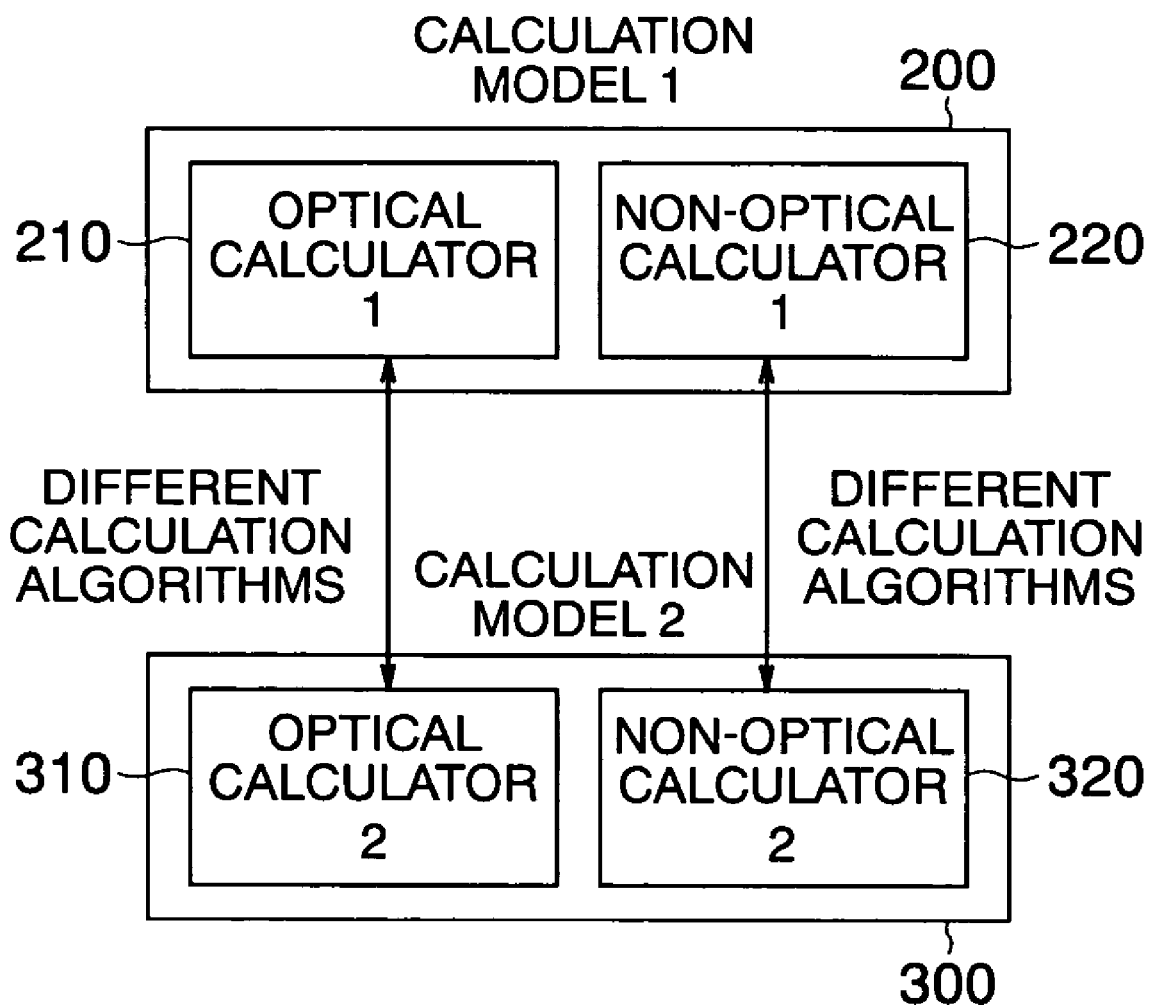
FIG. 5 is a view for explaining an optical calculator and non-optical calculator included in calculation models 1 and 2 in the first embodiment.

As shown in FIG. 5, a calculation model 1 200 and calculation model 2 300 include an optical calculator 1 210 and non-optical calculator 1 220, and an optical calculator 2 310 and non-optical calculator 2 320, respectively.

The optical calculator 1 210 and optical calculator 2 310 perform calculations related to optical elements for predicting the intensity of light which irradiates a wafer. For example, these optical calculators calculate the light intensity distributions of various design patterns on a wafer on the basis of parameters such as the exposure wavelength ($\lambda$) and lens numerical aperture (NA) of an exposure apparatus used, values ($\sigma$, $\epsilon$) which determine an illumination shape, and the transmittance and phase, which are determined by the type of mask used (e.g., a Cr mask, HT mask, or phase shift mask), of light which is transmitted through the mask.

The non-optical calculator 1 220 performs calculations concerning development for simply representing a step in which a photosensitive agent, i.e., a resist applied on a wafer is developed by exposure light, and calculations for predicting changes in dimensions after the developed resist is etched. That is, this non-optical calculator performs calculations for predicting the way the resist irradiated with light under the exposure conditions described above changes its dimensions after steps such as a baking step and development step called resist processes, and the way the dimensions change after the resist is etched.

Figure 6:
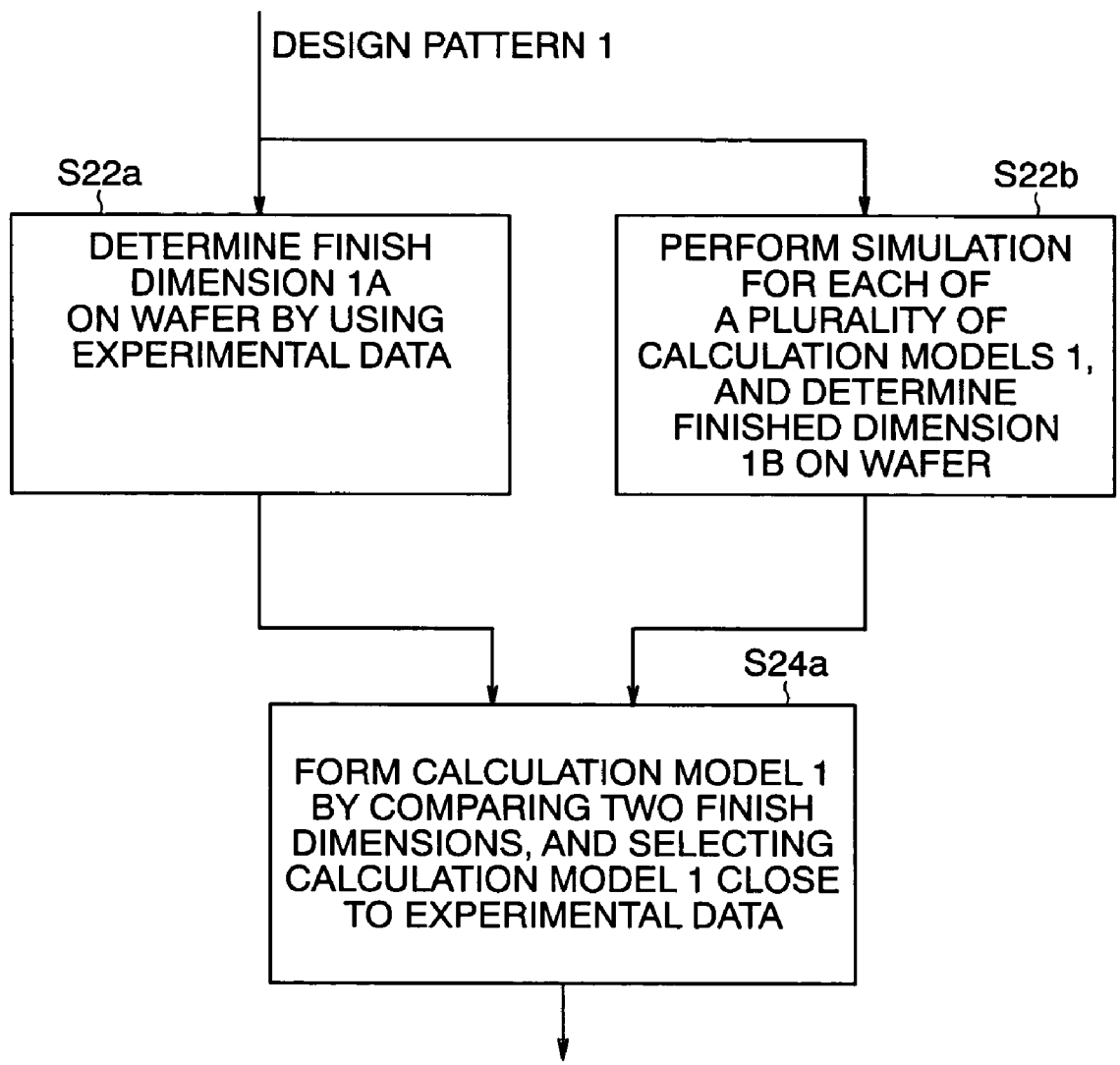
FIG. 6 is a flowchart showing details of a step of determining calculation model 1 in the pattern dimension correction method according to the first embodiment.

FIG. 6 shows a practical example of the contents of the processes in steps S22 and S24.

As shown in step S22a, a pattern is formed and measured on the basis of design pattern 1. The obtained measurement data is used to determine finish dimension 1A on a wafer.

In step S22b, a plurality of calculation models 1 are formed on the basis of design pattern 1. Simulation is performed using each calculation model 1, thereby determining finish dimension 1B on a wafer.

In step S24a, the two finish dimensions are compared to select and determine calculation model 1 by which finish dimension 1B close to finish dimension 1A based on the measurement data obtained in step S22a is obtained.

In this embodiment, the experimental load can be reduced by measuring finish dimension 1 by conducting an experiment on representative design pattern 1, predicting another finish dimension 2 by using high-accuracy calculation model 1, and predicting remaining finish dimension 3 by using high-speed calculation model 2. In addition, simulation is performed by forming high-speed calculation model 2 by using finish dimension 2 obtained by simulation using high-accuracy calculation model 1. This makes it possible to predict the finish dimensions of all design patterns at high speed and high accuracy.

Also, high-accuracy pattern dimensions can be efficiently realized by forming a mask by correcting pattern dimensions by using the above correction method, and forming a semiconductor device by using the mask.

(2) Second Embodiment

The second embodiment of the present invention will be described below with reference to the accompanying drawings.

This embodiment is used when the finish dimensions of design patterns are calculated under a plurality of process conditions. The process conditions herein mentioned are the conditions of, e.g., the focus, exposure amount, mask bias dependence, lens system, and illumination shape of an exposure apparatus.

Figure 7:
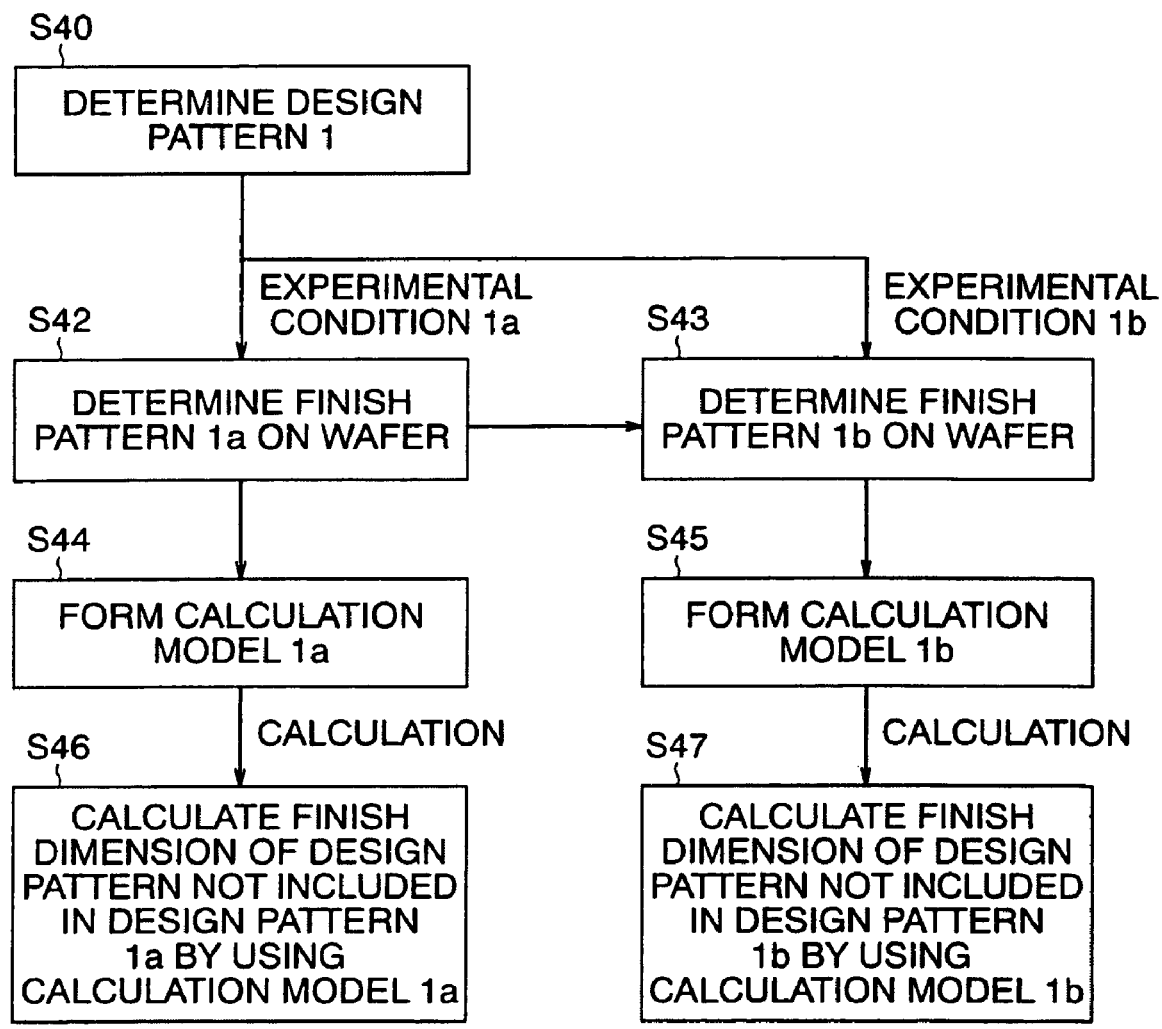
FIG. 7 is a flowchart showing conventional pattern dimension calculation methods when experimental conditions are different.

First, a conventionally performed method will be described with reference to FIG. 7.

In step S40, representative design pattern 1 is determined.

In step S42, under a certain process condition (experimental condition 1a), a pattern is formed on a wafer on the basis of design pattern 1, and the dimension of this finish pattern is measured to determine finish dimension 1a.

Similarly, in step S43, a pattern is formed on a wafer on the basis of design pattern 1 under another process condition (experimental condition 1b), and the dimension of this finish pattern is measured to determine finish dimension 1b.

In steps S44 and S45, calculation models 1a and 1b are formed by using finish dimensions 1a and 1b under the respective process conditions (experimental conditions 1a and 1b).

In steps S46 and S47, simulations are performed using calculation models 1a and 1b to calculate the finish dimensions of design patterns not included in design patterns 1a and 1b.

As described above, it is conventionally necessary to conduct an experiment under each process condition to form a calculation model and calculate a finish dimension.

When a large number of different process conditions are necessary, therefore, the method is very cumbersome, and the experimental load increases.

Figure 8:
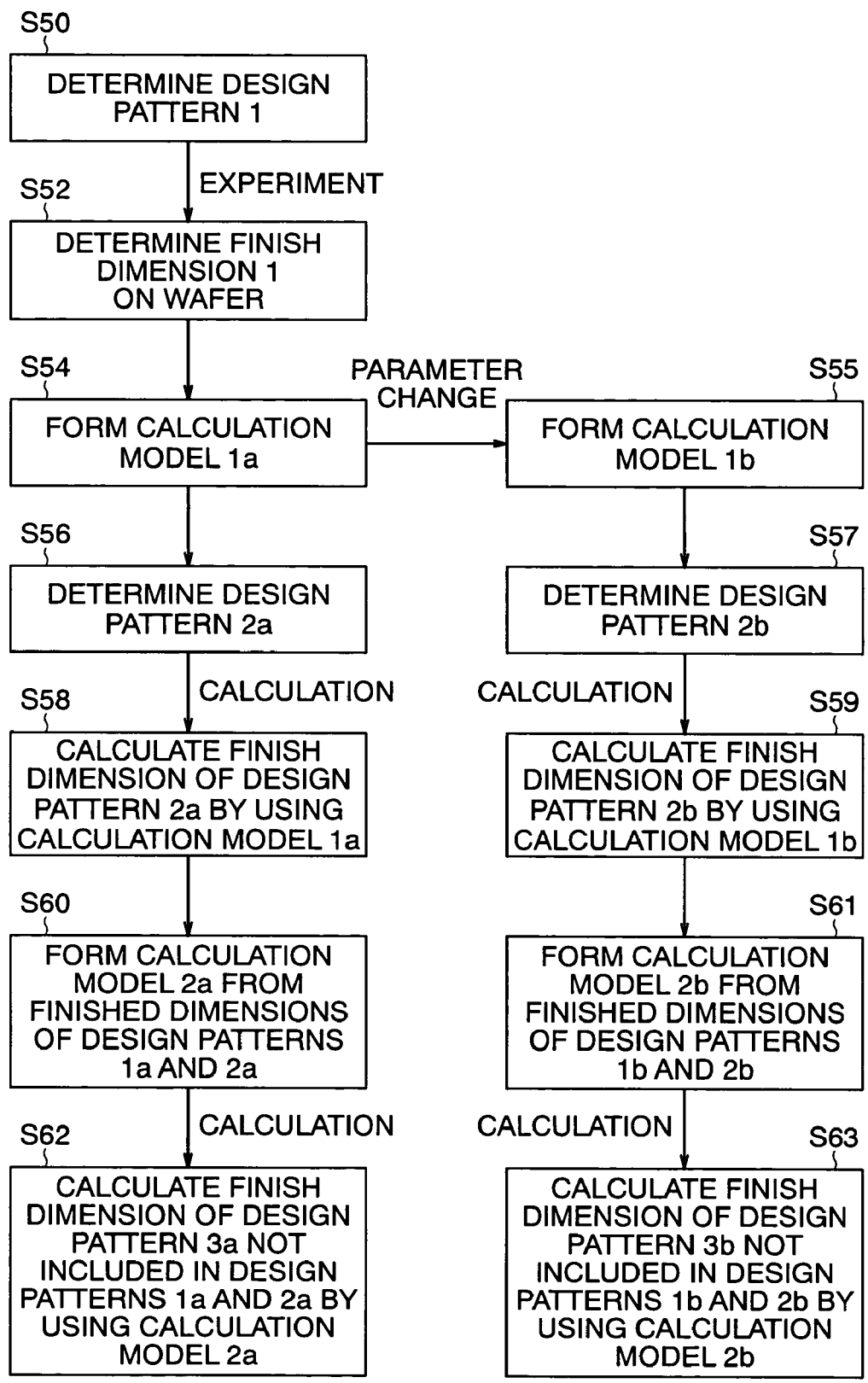
FIG. 8 is a flowchart showing pattern dimension correction methods according to the second embodiment of the present invention when experimental conditions are different.

By contrast, a method shown in FIG. 8 is used in this embodiment.

First, in step S50, design pattern 1 is selected and determined as a representative pattern. As in the first embodiment described above, the number of design patterns 1 is minimized in order to decrease the experimental load.

In step S52, finish dimension 1 when a pattern is formed on a wafer on the basis of design pattern 1 under predetermined process conditions is calculated.

In step S54, model parameter 1 matching finish dimension 1 obtained by measurement is determined, and high-accuracy calculation model 1a is formed.

In step S55 of this embodiment, calculation model 1b is formed by changing a parameter under the predetermined process conditions. The parameter can include at least one of the exposure amount, focus, mask transmittance, phase, aberration, pupil transmittance, illumination shape, lens numerical aperture, and exposure wavelength of an exposure apparatus, the average dimension and dimensional variation of a mask, and a development parameter.

In calculation models 1a and 1b, accuracy has preference to speed.

In step S56, design pattern 2a is determined from design patterns except for design pattern 1a.

Likewise, in step S57, design pattern 2b is determined from design patterns except for design pattern 1b.

In step S58, simulation is performed using calculation model 1a to calculate the finish dimension of design pattern 2a.

In step S59, simulation is performed using calculation model 1b to calculate the finish dimension of design pattern 2b.

In step S60, on the basis of the finish dimension of design pattern 1a obtained by the experiment and the finish dimension of calculated design pattern 2a, high-speed calculation model 2a in which speed has preference to accuracy is formed, and a parameter value is determined.

In step S61, on the basis of the finish dimension of design pattern 1b obtained by the experiment and the finish dimension of calculated design pattern 2b, high-speed calculation model 2b in which speed has preference to accuracy is formed, and a parameter value is determined.

In step S62, simulation is performed using calculation model 2a to calculate the finish dimensions of remaining design patterns not included in design patterns 1a and 2a.

Similarly, in step S63, simulation is performed using calculation model 2b to calculate the finish dimensions of remaining design patterns not included in design patterns 1b and 2b.

In this embodiment, even when the finish dimensions of design patterns are corrected under a plurality of process conditions, an experiment is performed once in step S52, and obtained finish dimension 1 is used to form a plurality of calculation models 1 by changing parameters. Since the remaining finish dimensions can be predicted by simulation, correction can be performed at high speed and high accuracy.

(3) Third Embodiment

The third embodiment of the present invention will be described below with reference to the accompanying drawings.

This embodiment relates to a pattern dimension correction method using OPC and an OPC verification method for corrected pattern dimensions.

Assume that calculation model 1 is one of calculation model 1 which is formed in step S24 of the first embodiment and gives preference to accuracy, and calculation models 1a and 1b which are formed in steps S54 and S55 of the second embodiment and give preference to accuracy, and calculation model 2 is one of calculation model 2 which is formed in step S30 of the first embodiment and gives preference to speed, and calculation models 2a and 2b which are formed in steps S60 and S61 of the second embodiment and give preference to speed.

Figure 9:
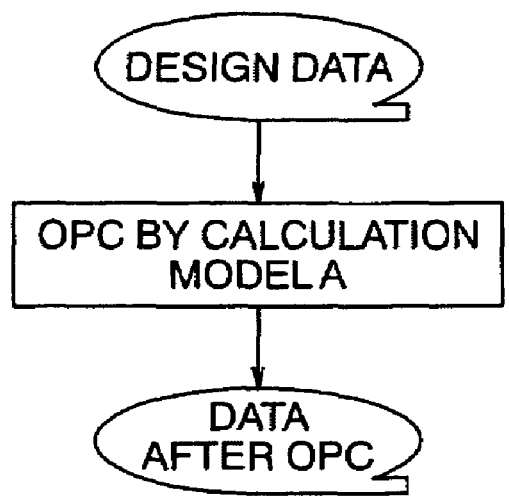
FIG. 9 is a flowchart showing a pattern dimension correction method using conventional OPC.

Conventionally, as shown in FIG. 9, data related to a design pattern is determined, and OPC is performed using calculation model A to correct a pattern dimension.

Figure 10:
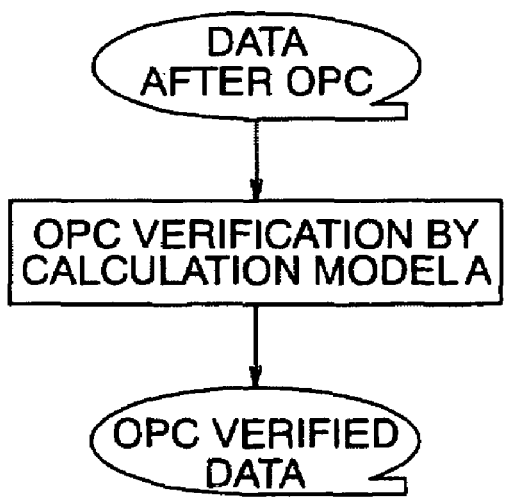
FIG. 10 is a flowchart showing a conventional pattern dimension OPC verification method.

As shown in FIG. 10, OPC verification is performed using calculation model A for the corrected pattern dimension after OPC, thereby obtaining OPC verified data.

Calculation model A is one of a model which gives preference to accuracy, and a model which gives preference to speed. Therefore, verification also has the problem that the accuracy or speed deteriorates.

Figure 11:
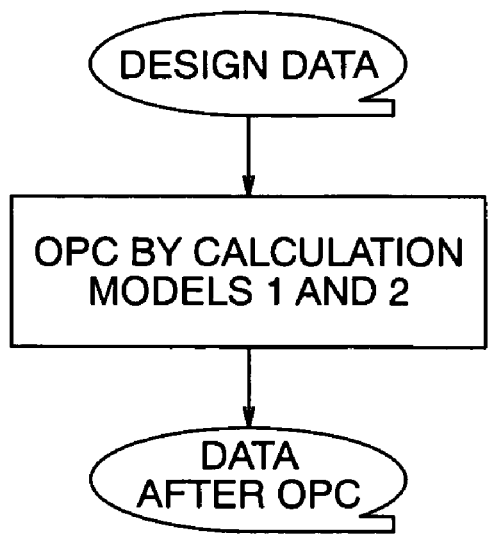
FIG. 11 is a flowchart showing a pattern dimension correction method using OPC according to the third embodiment of the present invention.

By contrast, in this embodiment as shown in FIG. 11, data related to a design pattern is determined, and OPC is performed using calculation models 1 and 2 to correct a pattern dimension.

Figure 12:
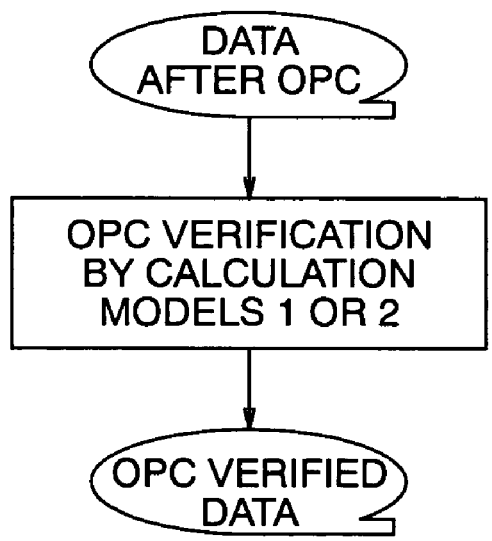
FIG. 12 is a flowchart showing a pattern dimension verification method using OPC according to the third embodiment.

As shown in FIG. 12, OPC verification is performed using calculation model 1 or 2 for the pattern dimension corrected by OPC, thereby obtaining OPC verified data.

As described above, correction is performed using high-accuracy calculation model 1 and high-speed calculation model 2, and OPC verification is performed for the obtained pattern dimension by using high-accuracy calculation model 1 or high-speed calculation model 2. As a consequence, both high correction accuracy and high speed can be realized.

Free combinations of calculation models 1 and 2 in pattern dimension correction using OPC and OPC verification of the corrected pattern dimension will be explained below.

Figure 13:
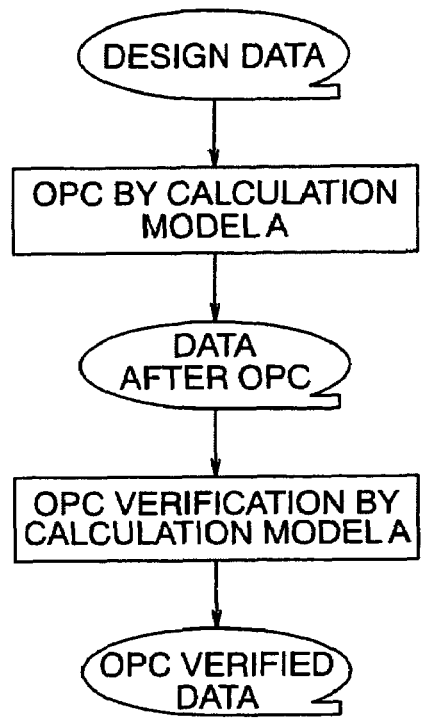
FIG. 13 is a flowchart showing pattern dimension correction and verification methods using conventional OPC.

Conventionally, as shown in FIG. 13, a pattern dimension is detected by OPC by using only calculation model A which gives preference to one of accuracy and speed, and OPC verified data is obtained by performing OPC verification by using calculation model A. Accordingly, only one of high accuracy and high speed can be realized.

By contrast, this embodiment can realize both desired accuracy and desired speed by freely combining calculation models 1 and 2 described above in each of pattern dimension correction and verification.

Figure 14:
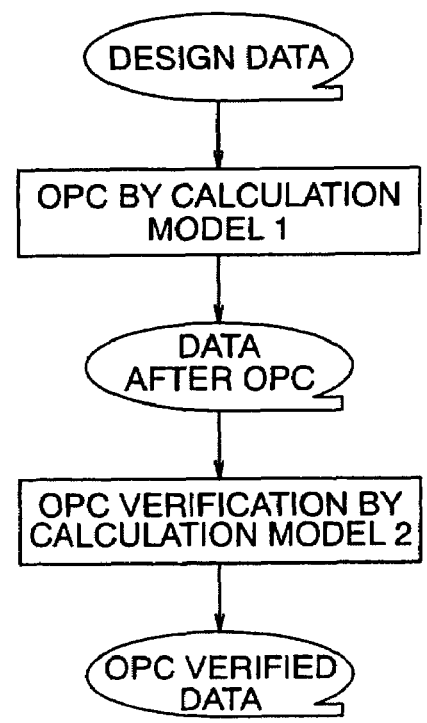
FIG. 14 is a flowchart showing pattern dimension correction and verification methods using OPC according to the third embodiment.

For example, as shown in FIG. 14, when pattern dimension correction is performed by OPC, high accuracy is realized by using calculation model 1 which gives preference to accuracy. On the other hand, verification can be performed at high speed by using calculation model 2 which gives preference to speed.

Figure 15:
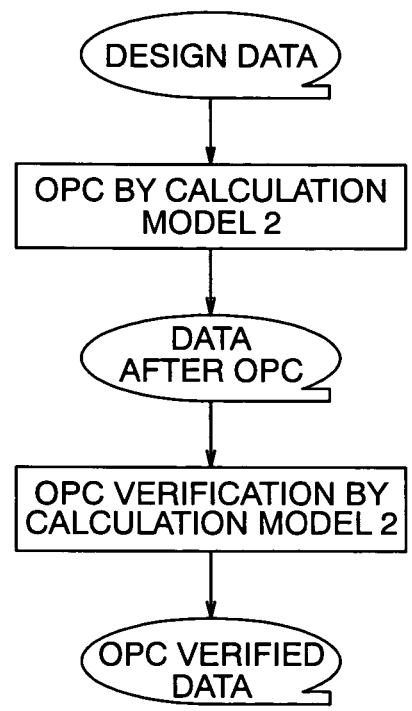
FIG. 15 is a flowchart showing pattern dimension correction and verification methods using another OPC according to the third embodiment.

Alternatively, as shown in FIG. 15, high speed can be realized in both correction and verification by using calculation model 2 which gives preference to speed in both the steps.

Figure 16:
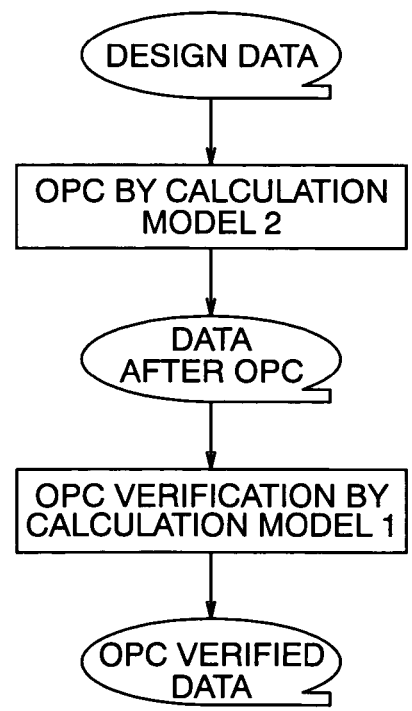
FIG. 16 is a flowchart showing pattern dimension correction and verification methods using still another OPC according to the third embodiment.

It is also possible, as shown in FIG. 16, to realize high speed in correction and high accuracy in verification by using calculation model 2 which gives preference to speed in the correction, and calculation model 1 which gives preference to accuracy in the verification.

Furthermore, as shown in FIGS. 14 and 16, when different calculation models 1 and 2 are used in correction and verification, crosscheck of these calculation models can be performed.

For example, if calculation model 1 has a problem in the case shown in FIG. 14, this problem of calculation model 1 can be extracted by performing OPC verification by using calculation model 2.

On the other hand, if calculation model 2 has a problem in the case shown in FIG. 16, this problem of calculation model 2 can be extracted by performing OPC verification by using calculation model 1.

In this embodiment as described above, the correction accuracy and correction time can be adjusted by freely combining calculation models 1 and 2 in accordance with the required correction accuracy and correction time.

As has been explained above, when the pattern dimension correction method using OPC of the above embodiments and the system and software product which implement the correction method are used, a first finish pattern dimension is measured on the basis of a representative design pattern, a high-accuracy calculation model is determined by using the obtained measurement data, simulation is performed using this high-accuracy calculation model to calculate a second finish pattern dimension of another design pattern, a high-speed calculation model is determined by using the first and second finished design patterns, and simulation is performed using this high-speed calculation model to calculate a third finish pattern dimension of the remaining design pattern. In this manner, it is possible to reduce the experimental load, and correct pattern dimensions by performing simulations at high speed and high accuracy.

Also, high-accuracy pattern dimensions can be efficiently realized by forming a mask on the basis of pattern dimensions obtained by using the above correction method, and fabricating a semiconductor device by using the mask.

Furthermore, in the pattern dimension OPC verification method of the above embodiment, finish pattern dimensions corrected by using OPC are verified by using an arbitrary one of a high-accuracy calculation model and high-speed calculation model as needed. This makes it possible to realize desired accuracy and desired speed.

Each of the above embodiments is merely an example and does not limit the present invention. Therefore, each embodiment can be variously modified within the technical scope of the present invention.

What is claimed is:

1. A method of correcting a finish pattern dimension by using OPC when a wafer design pattern is formed on a wafer, comprising:
   selecting and determining a first design pattern included in the wafer design pattern;
   acquiring a measurement value of a first finish pattern dimension when the first design pattern is formed on the wafer;
   determining a first calculation model by using the first finish pattern dimension;
   selecting and determining a second design pattern from the wafer design pattern except for the first design pattern;
   performing a first simulation by using the first calculation model, and calculating a second finish pattern dimension when the second design pattern is formed on the wafer;
   determining a second calculation model for performing a second simulation which is faster than the first simulation, by using the first finish pattern dimension and the second finish pattern dimension; and
   performing the second simulation by using the second calculation model, and calculating a third finish pattern dimension of a third design pattern of the wafer design pattern except for the first and second design patterns.

2. The method according to claim 1, wherein the first and second design patterns are different in at least one of a design pattern line width and a distance between adjacent design patterns.

3. The method according to claim 2, wherein each of the first, second, and third finish pattern dimensions is one of a mask dimension after a mask process, a resist dimension after a lithography process, a processed dimension after an etching process, and a final processed dimension after a final process.

4. The method according to claim 3, wherein each of the first and second calculation models includes an optical calculator related to an optical element, and a non-optical calculator related to a non-optical element.

5. The method according to claim 4, wherein the optical calculator included in the first calculation model and the optical calculator included in the second calculation model have different optical calculation algorithms, and the non-optical calculator included in the first calculation model and the non-optical calculator included in the second calculation model have different non-optical calculation algorithms.

6. The method according to claim 5, wherein the first simulation is more accurate than the second simulation, and the first calculation model is more suited to executing the first simulation than the second calculation model.

7. The method according to claim 2, wherein each of the first and second calculation models includes an optical calculator related to an optical element, and a non-optical calculator related to a non-optical element.

8. The method according to claim 7, wherein the optical calculator included in the first calculation model and the optical calculator included in the second calculation model have different optical calculation algorithms, and the non-optical calculator included in the first calculation model and the non-optical calculator included in the second calculation model have different non-optical calculation algorithms.

9. The method according to claim 8, wherein the first simulation is more accurate than the second simulation, and the first calculation model is more suited to executing the first simulation than the second calculation model.

10. The method according to claim 1, wherein each of the first, second, and third finish pattern dimensions is one of a mask dimension after a mask process, a resist dimension after a lithography process, a processed dimension after an etching process, and a final processed dimension after a final process.

11. The method according to claim 1, wherein each of the first and second calculation models includes an optical calculator related to an optical element, and a non-optical calculator related to a non-optical element.

12. The method according to claim 11, wherein the optical calculator included in the first calculation model and the optical calculator included in the second calculation model have different optical calculation algorithms, and the non-optical calculator included in the first calculation model and the non-optical calculator included in the second calculation model have different non-optical calculation algorithms.

13. The method according to claim 1, wherein the first simulation is more accurate than the second simulation, and the first calculation model is more suited to executing the first simulation than the second calculation model.

14. A pattern dimension verification method using OPC, comprising, performing OPC verification for the first, second, and third pattern dimensions by using the first or second calculation model cited in claim 1.

15. A method of correcting a finish pattern dimension by using OPC when a wafer design pattern is formed on a wafer, comprising:
   selecting and determining a first design pattern and a second design pattern included in the wafer design pattern;
   acquiring a measurement value of a first finish pattern dimension when the first design pattern is formed on the wafer;
   determining a first calculation model by using the first finish pattern dimension;
   determining at least one second calculation model by changing a value of a parameter included in the first calculation model;
   selecting and determining a third design pattern from the wafer design pattern except for the first design pattern;
   selecting and determining a fourth design pattern from the wafer design pattern except for the second design pattern;
   performing a first simulation by using the first calculation model, and calculating a second finish pattern dimension when the third design pattern is formed on the wafer;
   performing a second simulation by using the second calculation model, and calculating a third finish pattern dimension when the third design pattern is formed on the wafer;
   determining a third calculation model for performing a third simulation which is faster than the first simulation, by using the first finish pattern dimension and second finish pattern dimension;
   determining a fourth calculation model for performing a fourth simulation which is faster than the second simulation, by using a fourth finish pattern dimension and the third finish pattern dimension;
   performing the third simulation by using the third calculation model, and calculating a fifth finish pattern dimension of a fourth design pattern of the wafer design pattern except for the first design pattern and third design pattern; and
   performing the fourth simulation by using the fourth calculation model, and calculating a sixth finish pattern dimension of a sixth design pattern of the wafer design pattern except for the second design pattern and the fourth design pattern.

16. The method according to claim 15, wherein the parameter includes at least one of an exposure amount, focus, mask transmittance, phase, aberration, pupil transmittance, illumination shape, lens numerical aperture, and exposure wavelength of an exposure apparatus, an average dimension and dimensional variation of a mask, and a development parameter.

17. A mask formed by using a first finish pattern dimension, a second finish pattern dimension, and a third finish pattern dimension obtained by a pattern dimension correction method which uses OPC and comprises:
   selecting and determining a first design pattern included in a wafer design pattern;
   acquiring a measurement value of the first finish pattern dimension when the first design pattern is formed on a wafer;
   determining a first calculation model by using the first finish pattern dimension;
   selecting and determining a second design pattern from the wafer design pattern except for the first design pattern;
   performing a first simulation by using the first calculation model, and calculating the second finish pattern dimension when the second design pattern is formed on the wafer;
   determining a second calculation model for performing a second simulation which is faster than the first simulation, by using the first finish pattern dimension and second finish pattern dimension; and
   performing the second simulation by using the second calculation model, and calculating the third finish pattern dimension of a third design pattern of the wafer design pattern except for the first design pattern and second design pattern.

18. A semiconductor device fabricated by using a mask formed by using a first finish pattern dimension, a second finish pattern dimension, and a third finish pattern dimension obtained by a pattern dimension correction method which uses OPC and comprises:
   selecting and determining a first design pattern included in a wafer design pattern;
   acquiring a measurement value of the first finish pattern dimension when the first design pattern is formed on a wafer;
   determining a first calculation model by using the first finish pattern dimension;
   selecting and determining a second design pattern from the wafer design pattern except for the first design pattern;
   performing a first simulation by using the first calculation model, and calculating the second finish pattern dimension when the second design pattern is formed on the wafer;
   determining a second calculation model for performing a second simulation which is faster than the first simulation, by using the first finish pattern dimension and second finish pattern dimension; and
   performing the second simulation by using the second calculation model, and calculating the third finish pattern dimension of a third design pattern of the wafer design pattern except for the first design pattern and second design pattern.

19. A system for executing a method of correcting a finish pattern dimension by using OPC when a wafer design pattern is formed on a wafer, comprising:
   a first finish pattern dimension input unit which inputs a measurement value of a first finish pattern dimension when a first design pattern selected from the wafer design pattern is formed on the wafer;
   a first calculation model determination unit which determines a first calculation model by using the input first finish pattern dimension;
   a second design pattern input unit which inputs a second design pattern of the wafer design pattern except for the first design pattern;
   a first simulation unit which performs a first simulation by using the first calculation model, and calculates a second finish pattern dimension when the second design pattern is formed on the wafer;
   a second calculation model determination unit which determines a second calculation model for performing a second simulation which is faster than the first simulation, by using the first finish pattern dimension and second finish pattern dimension; and
   a second simulation unit which performs the second simulation by using the second calculation model, and calculates a third finish pattern dimension of a third design pattern of the wafer design pattern except for the first design pattern and second design pattern.

20. A software product obtained by recording, in a computer-readable medium, a program for implementing, on a computer, a system for executing a method of correcting a finish pattern dimension by using OPC when a wafer design pattern is formed on a wafer, wherein the program comprises:
   a first finish pattern dimension input unit which inputs a measurement value of a first finish pattern dimension when a first design pattern selected from the wafer design pattern is formed on the wafer;
   a first calculation model determination unit which determines a first calculation model by using the input first finish pattern dimension;
   a second design pattern input unit which inputs a second design pattern of the wafer design pattern except for the first design pattern;
   a first simulation unit which performs a first simulation by using the first calculation model, and calculates a second finish pattern dimension when the second design pattern is formed on the wafer;
   a second calculation model determination unit which determines a second calculation model for performing a second simulation which is faster than the first simulation, by using the first finish pattern dimension and second finish pattern dimension; and
   a second simulation unit which performs the second simulation by using the second calculation model, and calculates a third finish pattern dimension of a third design pattern of the wafer design pattern except for the first design pattern and second design pattern.

* * * * *